(12) United States Patent  
Cho

(10) Patent No.: US 9,196,378 B2  
(45) Date of Patent: Nov. 24, 2015

(54) SEMICONDUCTOR MEMORY DEVICE AND OPERATING METHOD THEREOF

(71) Applicant: SK hynix Inc., Gyeonggi-do (KR)

(72) Inventor: Seon-Ki Cho, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/509,852

(22) Filed: Oct. 8, 2014

(65) Prior Publication Data

US 2015/0310925 A1 Oct. 29, 2015

(30) Foreign Application Priority Data

Apr. 24, 2014 (KR) .................. 10-2014-0049282

(51) Int. Cl.
*G11C 17/18* (2006.01)
*G11C 17/16* (2006.01)
*G11C 29/00* (2006.01)

(52) U.S. Cl.
CPC ............... *G11C 17/18* (2013.01); *G11C 17/16* (2013.01); *G11C 29/72* (2013.01); *G11C 29/76* (2013.01); *G11C 29/78* (2013.01); *G11C 29/835* (2013.01); *G11C 29/838* (2013.01)

(58) Field of Classification Search
CPC ........ G11C 17/18; G11C 17/16; G11C 29/76; G11C 29/78; G11C 29/72; G11C 29/835; G11C 29/838
See application file for complete search history.

(56) References Cited

U.S. PATENT DOCUMENTS

| 5,325,334 | A  | * | 6/1994 | Roh et al. | 365/201 |
| 6,285,619 | B1 | * | 9/2001 | Daniel et al. | 365/225.7 |
| 6,940,776 | B2 | * | 9/2005 | Cho | 365/225.7 |
| 8,335,098 | B2 | * | 12/2012 | Shen | 365/94 |
| 2013/0265815 | A1 | * | 10/2013 | Kim et al. | 365/96 |

FOREIGN PATENT DOCUMENTS

KR 1020110088918 8/2011

* cited by examiner

*Primary Examiner* — Vanthu Nguyen
(74) *Attorney, Agent, or Firm* — IP & T Group LLP

(57) ABSTRACT

A semiconductor memory device includes a fuse array block including a plurality of fuses programmed with state information, an operation direction control block suitable for controlling a program operation direction and a boot-up operation direction of the fuse array block, and a fuse information loading block suitable for loading the state information which is programmed in the plurality of fuses of the fuse array block through the boot-up operation.

20 Claims, 7 Drawing Sheets

SEMICONDUCTOR MEMORY DEVICE AND OPERATING METHOD THEREOF

CROSS-REFERENCE TO RELATED APPLICATIONS

The present application claims priority of Korean Patent Application No. 10-2014-0049282, filed on Apr. 24, 2014, which is incorporated herein by reference in its entirety.

BACKGROUND

1. Field

Exemplary embodiments of the present invention relate to a semiconductor design technology and, more particularly, to a semiconductor memory device for storing various pieces of state information.

2. Description of the Related Art

In general, a semiconductor memory device such as Double Data Rate Synchronous Dynamic Random Access Memory (DDR SDRAM) includes a circuit for storing its state information. The state information means a characteristic value of a semiconductor memory device. A plurality of semiconductor memory devices have to know their own characteristic values in order to operate according to the same standard. The state information may be obtained from a test operation, etc., and a fuse may be used as a circuit for storing the state information.

Hereinafter, a series of operations for storing state information in a fuse is referred to as a program operation. A method for programming state information in a fuse is largely divided into a physical scheme and an electrical scheme.

The physical scheme is to cut a fuse by using a laser beam and blowing the fuse with the laser beam based on state information to be programmed. The fuse used in the physical scheme is referred to as a physical-type fuse. Since the laser beam is used to cut the connection state of the fuse, the fuse is also referred to as a laser blowing-type fuse. The physical-type fuse may be programmed only in a wafer stage before the semiconductor memory device is packaged.

The electrical scheme changes the connection state of a fuse by applying an overcurrent to the fuse based on state information to be programmed. The fuse used in the electrical scheme is referred to as an electrical-type fuse. The electrical-type fuse may be divided into anti-type fuses and blowing-type fuses. When being programmed, the anti-type fuse changes from an open state to a short state and the blowing-type fuse changes from a short state to an open state. In the case of the electrical-type fuse a program operation may be performed even in a package stage, unlike the physical-type fuse. Thus, the electrical-type fuse is considered an essential component in designing a semiconductor memory device.

Since a semiconductor memory device is required to perform diverse operations, the semiconductor memory device is designed to perform many functions. The increase in the number of functions of the semiconductor memory device indicates an increase in the number of fuses for storing the state information for the respective functions. A fuse array circuit has been introduced to manage a large number of fuses more efficiently.

FIG. 1 is a block diagram illustrating a portion of structures of a typical semiconductor memory device. For the simple description, it is described as an example that the semiconductor memory device includes a fuse array circuit that adopts the electrical scheme (See 130 in FIG. 1).

Referring to FIG. 1, the semiconductor memory device includes a command decoding block 110, a control signal generation block 120, a fuse array block 130, and a fuse information loading block 140.

The command decoding block 110 decodes a command signal CMD and generates internal command signals such as a programming command signal CMD_PRG and a boot-up command signal CMD_BTU. The programming command signal CMD_PRG and the boot-up command signal CMD_BTU are described below.

The control signal generation block 120 generates a programming control signal CTR_PRG corresponding to state information INF_ST in response to the programming command signal CMD_PRG. The state information INF_ST may be provided as a signal having information on a characteristic value of the semiconductor memory device, which is obtained through a test operation, etc. The programming control signal CTR_PRG is a signal for changing a connection state of a fuse included in the fuse array block 130 based on the state information INF_ST.

The fuse array block 130 performs a program operation in response to the programming control signal CTR_PRG. The programming control signal CTR_PRG corresponds to the state information INF_ST as described above. For this reason, the state information INF_ST is programmed in the fuse array block 130. Subsequently, the fuse array block 130 outputs the programmed state information in response to the boot-up command signal CMD_BTU.

The fuse information loading block 140 receives and stores the state information which is programmed in the fuse array block 130, and the stored state information serves a variety of uses during normal operations of the semiconductor memory device.

Hereinafter, a method of controlling a fuse array circuit is described.

SUMMARY

Exemplary embodiments of the present invention are directed to a semiconductor memory device that may control a program operation and a boot-up (booting) operation of a fuse array circuit.

In accordance with an embodiment of the present invention, a fuse array block including a plurality of fuses programmed with state information; an operation direction control block suitable for controlling a program operation direction and a boot-up operation direction of the fuse array block; and a fuse information loading block suitable for loading the state information which is programmed in the plurality of fuses of the fuse array block through the boot-up operation.

The operation direction control block may include a programming order control block suitable for controlling the program operation direction of the fuse array block, and a boot-up order control block suitable for controlling the boot-up operation direction of the fuse array block.

The semiconductor memory device may further include a command decoding block suitable for decoding a command signal and generating an internal command signal corresponding to a program operation and a boot-up operation of the fuse array block; and a control signal generation block suitable for generating a programming control signal for changing connection states of the fuses and applying the programming control signal to the operation direction control block in response to the state information.

The programming order control block may receive the programming control signal and sequentially apply the programming control signal to programming target fuses among the fuses in an order determined based on the program operation direction.

The fuse array block may sequentially output the state information which is programmed in the fuses in an order determined based on an output signal of the boot-up order control block.

The program operation direction may be opposite to the boot-up operation direction.

The fuse array block may be divided into a first fuse array block and a second fuse array block, and the operation direction control block may control program operation directions and boot-up operation directions of the first and second fuse array blocks.

The first and second fuse array blocks may be distinguished from one another based on kinds of the state information which is programmed therein.

In accordance with another embodiment of the present invention, a semiconductor memory device includes a fuse array block including a plurality of fuses programmed with repair target address information, a programming order control block suitable for controlling a program operation direction of the fuse array block, a boot-up order control block suitable for controlling a boot-up operation direction of the fuse array block in an opposite direction to the program operation direction, and a fuse information loading block suitable for loading the repair target address information which is programmed in the plurality of fuses of the fuse array block through the boot-up operation.

The semiconductor memory device may further include a data comparison block suitable for comparing a repair target address which is loaded on the fuse information loading block with a repair target address which is outputted from the fuse array block through the boot-up operation and generating an operation control signal.

The boot-up order control block may control whether the boot-up operation is performed in response to the operation control signal.

The fuse array block may output the target address information during the boot-up operation in a reverse order to the manner in which the target address information is programmed in the plurality of fuses.

The repair target address, which is loaded in the fuse information loading block, may be used for a repair operation of the semiconductor memory device.

In accordance with another embodiment of the present invention, a method for operating a semiconductor memory device includes setting up a program operation direction and a boot-up operation direction for a plurality of fuses, programming repair target address information in the fuses based on the program operation direction which is set up in the setting up, comparing the repair target address information which is programmed in the fuses, determining whether to perform a boot-up operation in response to a result obtained from the comparing of the repair target address information, and booting up the repair target address information which is programmed in the fuses based on the boot-up operation direction which is set up in the setting up, in response to a result obtained from the determining.

The method for operating the semiconductor memory device may further include passing the boot-up operation in response to the result obtained from the determining.

The method for operating the semiconductor memory device may further include loading a repair target address which is outputted through the booting-up of the repair target address information.

The comparing of the repair target address information may include comparing the repair target address, which is loaded in the loading, with the repair target address which is outputted through the booting-up.

The program operation direction may be opposite to the boot-up operation direction.

In accordance with another embodiment of the present invention, a semiconductor memory device includes A semiconductor memory device includes a fuse array block including a plurality of fuses; a programming order control block suitable for programming state information in the plurality of fuses in a first order; and a boot-up order control block suitable for controlling the fuse array block to output state information programmed in the plurality of fuses in a second order, wherein the first and second orders are in reverse.

The semiconductor memory device may further include a fuse information loading block suitable for loading state information outputted from the fuse array block; and a data comparison block suitable for comparing the state information outputted from the fuse array block with state information loaded on the fuse information loading block and generating an operation control signal, wherein the boot-up order control block controls whether the fuse array block outputs the state information in response to the operation control signal.

As the program operation and the boot-up operation of the fuse array circuit included in the semiconductor memory device in accordance with the embodiments of the present invention are controlled, operation effectiveness of the fuse array circuit may increase.

DETAILED DESCRIPTION

Figure 1:
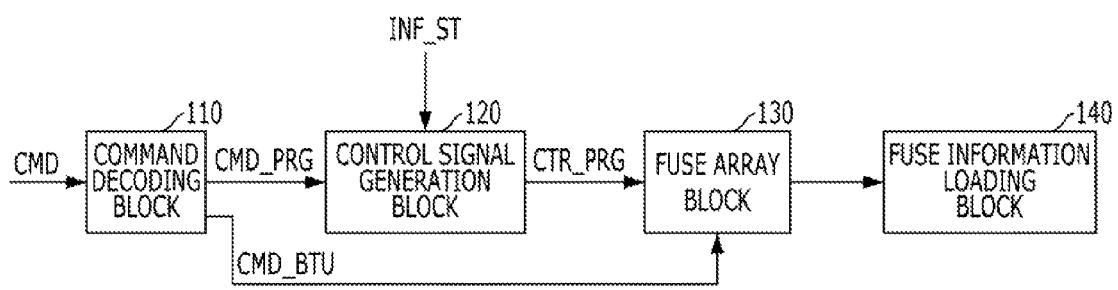
FIG. 1 is a block diagram illustrating a portion of structures of a typical semiconductor memory device.

Exemplary embodiments of the present invention are described below in more detail with reference to the accompanying drawings. The present invention may, however, be embodied in different forms and should not be construed as limited to the embodiments set forth herein. Rather, these embodiments are provided so that this disclosure is thorough and complete, and fully conveys the scope of the present invention to those skilled in the art. Throughout the disclosure, like reference numerals refer to like parts throughout the various figures and embodiments of the present invention.

Figure 2:
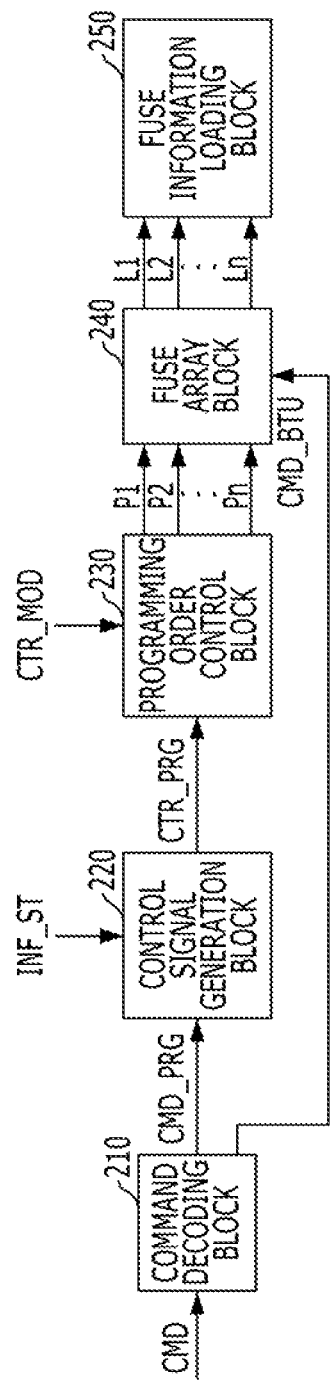
FIG. 2 is a block diagram illustrating a portion of structures of a semiconductor memory device in accordance with an embodiment of the present invention.

FIG. 2 is a block diagram illustrating a portion of structures of a semiconductor memory device in accordance with an embodiment of the present invention. For the simple description, it is described as an example that the semiconductor memory device includes a fuse array circuit that adopts the electrical scheme (See 240 in FIG. 2).

Referring to FIG. 2, the semiconductor memory device may include a command decoding block 210, a control signal generation block 220, a programming order control block 230, a fuse array block 240 and a fuse information loading block 250.

The command decoding block 210 decodes a command signal CMD and generates such internal command signals as a programming command signal CMD_PRG and a boot-up command signal CMD_BTU. The programming command signal CMD_PRG and the boot-up command signal CMD_BTU are described below.

The control signal generation block 220 generates a programming control signal CTR_PRG corresponding to state information INF_ST in response to the programming command signal CMD_PRG. The state information INF_ST may be provided as a signal having information on a state of the semiconductor memory device, which is obtained through a test operation etc. Herein, the state information INF_ST has information to be programmed in the fuse array block 240. The programming control signal CTR_PRG is a signal for changing a connection state of a fuse included in the fuse array block 230 based on the state information INF_ST. In the electrical scheme, an overvoltage or an overcurrent may be supplied to a programming target fuse as the programming control signal CTR_PRG.

The programming order control block 230 controls a program operation direction of the fuse array block 240 in response to a mode control signal CTR_MOD. The programming order control block 230 applies the programming control signal CTR_PRG to a programming target fuse of the fuse array block 240 in a direction determined by the mode control signal CTR_MOD. The programming order control block 230 may perform a program operation in a forward direction or in a reverse direction based on the mode control signal CTR_MOD. When the fuse array block 240 includes a plurality of fuses in rows and columns, the state information may be programmed on the basis of each row. In the forward direction, the program operation may be performed down from the top row of the fuse array block 240. In other words, the programming control signal CTR_PRG is outputted as signals P1 to Pn and the signals P1 to Pn are applied to programming target fuses in order of the first to nth signals P1→P2→ . . . →Pn. In the reverse direction, the program operation may be performed up from the bottom row of the fuse array block 240, which is contrary to the forward direction. In other words, the programming control signal CTR_PRG is outputted as signals Pn to P1 and the signals Pn to P1 are applied to programming target fuses in order of the nth to first signals Pn→ . . . →P2→P1.

The fuse array block 240 performs the program operation in response to output signals P1, P2, . . . , and Pn of the programming order control block 230. In other words, the state information INF_ST is programmed in the fuse array block 240 in a programming direction determined by the mode control signal CTR_MOD. Subsequently, the fuse array block 240 outputs the state information which is programmed as output signals L1, L2, . . . , and Ln in response to the boot-up command signal CMD_BTU. The output signals L1, L2, . . . , and Ln of the fuse array block 240 may be outputted in the forward direction. Control operations on the output signals L1, L2, . . . , and Ln of the fuse array block 240 are described in detail with reference to FIG. 3.

The fuse information loading block 250 receives and loads the state information which is programmed in the fuse array block 240. The fuse information loading block 250 may be formed of a latch circuit capable of latching the state information which is programmed. The state information which is latched serves a variety of uses during a normal operation of the semiconductor memory device.

The semiconductor memory device in accordance with the embodiment of the present invention may selectively control the programming direction when the state information INF_ST is programmed in the fuse array block 240.

Although it is described that just the program operation direction is controlled in the embodiment of FIG. 2, the semiconductor memory device in accordance with the embodiment of the present invention may control a boot-up (booting) operation direction as well.

Figure 3:
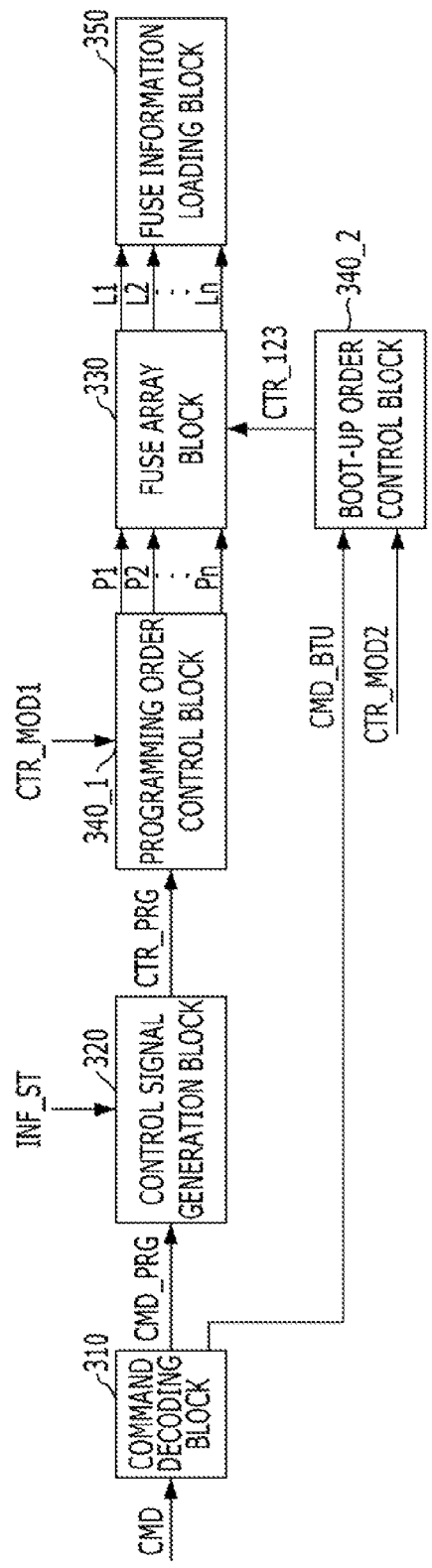
FIG. 3 is a block diagram illustrating a semiconductor memory device in accordance with another embodiment of the present invention.

FIG. 3 is a block diagram illustrating a semiconductor memory device in accordance with another embodiment of the present invention.

Referring to FIG. 3, the semiconductor memory device may include a command decoding block 310, a control signal generation block 320, a fuse array block 330, operation direction control blocks 340_1 and 340_2, and a fuse information loading block 350. The command decoding block 310, the control signal generation block 320, the fuse array block 330 and the fuse information loading block 350 shown in FIG. 3 correspond to the command decoding block 210, the control signal generation block 220, the fuse array block 240 and the fuse information loading block 250 shown in FIG. 2, respectively. Therefore, a detailed description thereon is omitted, and the newly added operation direction control blocks 340_1 and 340_2 are described hereafter.

The operation direction control blocks 340_1 and 340_2 control a program operation direction and a boot-up operation direction of the fuse array block 330. The operation direction control blocks 340_1 and 340_2 are divided into a programming order control block 340_1 and a boot-up order control block 340_2.

The programming order control block 340_1 controls the program operation direction of the fuse array block 330 in response to a first mode control signal CTR_MOD1. The programming order control block 340_1 applies a programming control signal CTR_PRG to a programming target fuse of the fuse array block 330 in a direction determined by the first mode control signal CTR_MOD1. The programming order control block 340_1 may perform a program operation in a forward direction or in a reverse direction based on the first mode control signal CTR_MOD1.

The boot-up order control block 340_2 controls the boot-up operation direction of the fuse array block 330 in response to a second mode control signal CTR_MOD2. In other words, the boot-up order control block 340_2 generates a boot-up enable control signal CTR_123 in response to the second mode control signal CTR_MOD2, and the fuse array block 330 outputs state information which is programmed in the fuse array block 330 as output signals L1, L2, . . . , and Ln in response to the boot-up enable control signal CTR_123. The fuse array block 330 may perform a boot-up operation in a forward direction or in a reverse direction based on the boot-up enable control signal CTR_123 corresponding to the second mode control signal CTR_MOD2.

In the forward direction, the boot-up operation may be performed down from the top row of the fuse array block 330. In other words, the state information which is programmed is outputted in order of the first to nth output signals L1→L2→ . . . →Ln and transmitted to the fuse information loading block 350. In the reverse direction the boot-up operation is performed up from the bottom row of the fuse array block 330, which is contrary to the forward direction. In other words, the state information which is programmed is outputted in order of the nth to first output signals Ln→ ... → L2→L1 and transmitted to the fuse information loading block 350.

The semiconductor memory device in accordance with the embodiment of the present invention may selectively control the program operation direction of the fuse array block 330 and the boot-up operation direction of the fuse array block 330.

A semiconductor memory device may include a large number of memory cells. As the integration degree of the semiconductor memory device increases with technological advances, the number of the memory cells greatly increases. When a defect occurs in even one memory cell among the memory cells, the semiconductor memory device including the defective memory cell may not perform a predetermined operation, and then has to be abandoned. Since the fabrication process technology of the semiconductor memory device is developed, the defect occurs in just a few memory cells stochastically. Considering production yield, it is inefficient to abandon the entire semiconductor memory device as a defective product due to a few defects. Therefore, in order to make up for the defect, the semiconductor memory device includes redundancy memory cells in addition to normal memory cells.

When a defect occurs in a normal memory cell, the redundancy memory cell is a circuit for the purpose of repairing the normal memory cell in which the defect occurs (hereinafter, refer to as "a repair target memory cell"). To be specific, when the repair target memory cell is accessed, e.g., during read and write operations, the redundancy memory cell may be accessed internally instead of the repair target memory cell. Therefore, when an address corresponding to the repair target memory cell is inputted, the semiconductor memory device performs an operation for accessing not the repair target memory cell but the redundancy memory cell (hereinafter, refer to as "a repair operation"), and a normal operation is guaranteed through the repair operation.

Meanwhile, the semiconductor memory device requires circuit structures other than the redundancy memory cells in order to perform the repair operation, and one of the circuit structures is a repair fuse circuit. The repair fuse circuit stores an address corresponding to the repair target memory cell (hereinafter, refer to as "a repair target address"). The repair fuse circuit is formed of a plurality of fuses, and the repair target address is programmed in the fuses. The semiconductor memory device performs the repair operation on a defective memory cell based on the repair target address which is programmed in the fuses.

The semiconductor memory device in which the repair target address is programmed in the fuse array circuit, and the programmed repair target address that is loaded through the boot-up operation is described hereafter.

Figure 4:
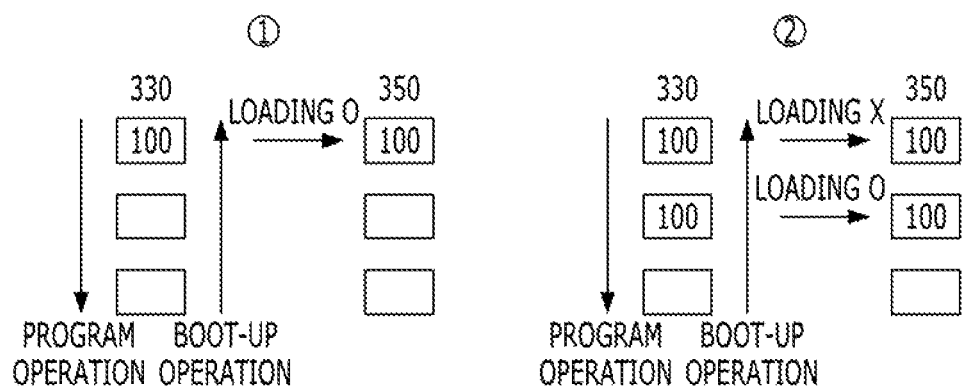
FIGS. 4 and 5 illustrate a program operation and a boot-up operation of the semiconductor memory device in accordance with the embodiment of the present invention.
Figure 5:
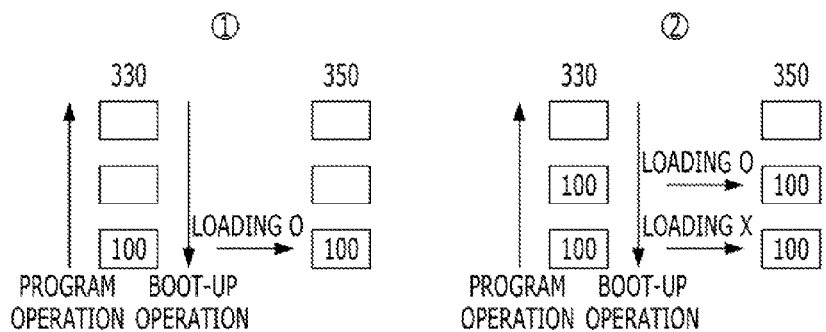

FIGS. 4 and 5 illustrate a program operation and a boot-up operation of the semiconductor memory device in accordance with the embodiment of the present invention. It is described as an example that a repair target address is programmed a fuse array circuit of the semiconductor memory device.

FIG. 4 shows a case where the program operation is performed in a forward direction, and the boot-up operation is performed in a reverse direction. For the simple description, it is described as an example that the repair target address is set to '100'.

Referring to FIG. 3, when the repair target address is inputted through the state information INF_ST, the programming order control block 340_1 performs the program operation in the forward direction on the fuse array block 330. In other words, as shown in ① of FIG. 4, the repair target address '100' is programmed in a first fuse which is disposed in the top portion among the fuses included in the fuse array block 330. Subsequently, the repair target address '100' is loaded to the fuse information loading block 350 through the boot-up operation.

When a defect also occurs in a redundancy memory cell for repair, as shown in ② of FIG. 4, the repair target address '100' is programmed in a second fuse of the fuse array block 330. Subsequently, the repair target address '100' which is programmed in the second fuse is loaded to the fuse information loading block 350 through the boot-up operation which is performed in a reverse direction. Since the repair target address '100' is already loaded in a first latch circuit of the fuse information loading block 350, it is possible not to perform the boot-up operation on the first fuse by comparing the repair target address '100' which is inputted through the boot-up operation with the repair target address '100' which is latched in the first latch circuit. A detailed description on the relevant circuit block is made below with reference to FIG. 8.

FIG. 5 shows a case where the program operation is performed in a reverse direction, and the boot-up operation is performed in a forward direction. For the simple description, it is described as an example that the repair target address is set to '100'.

As shown in ① of FIG. 5, the repair target address '100' is programmed in a third fuse which is disposed in the bottom portion among the fuses included in the fuse array block 330. Subsequently, the repair target address '100' is loaded to the fuse information loading block 350 through the boot-up operation.

When a defect also occurs in a redundancy memory cell for repair, as shown in ② of FIG. 5, the repair target address '100' is programmed in the second fuse of the fuse array block 330. Subsequently, the repair target address '100' which is programmed in the second fuse is loaded to the fuse information loading block 350 through the boot-up operation which is performed in a forward direction. Since the repair target address '100' is already loaded in a third latch circuit of the fuse information loading block 350, it is possible not to perform the boot-up operation on the third fuse by comparing the repair target address '100' which is inputted through the boot-up operation with the repair target address '100' which is latched in the third latch circuit. A detailed description on the relevant circuit block is made below with reference to FIG. 8.

The semiconductor memory device in accordance with the embodiment of the present invention may set up the program operation direction and the boot-up operation direction to be opposite to each other. When the same repair target address is programmed, the repair target address which is programmed later may be outputted in advance during the boot-up operation. As a result, the boot-up operation may be minimized, and an unnecessary loading operation may be removed.

Figure 6:
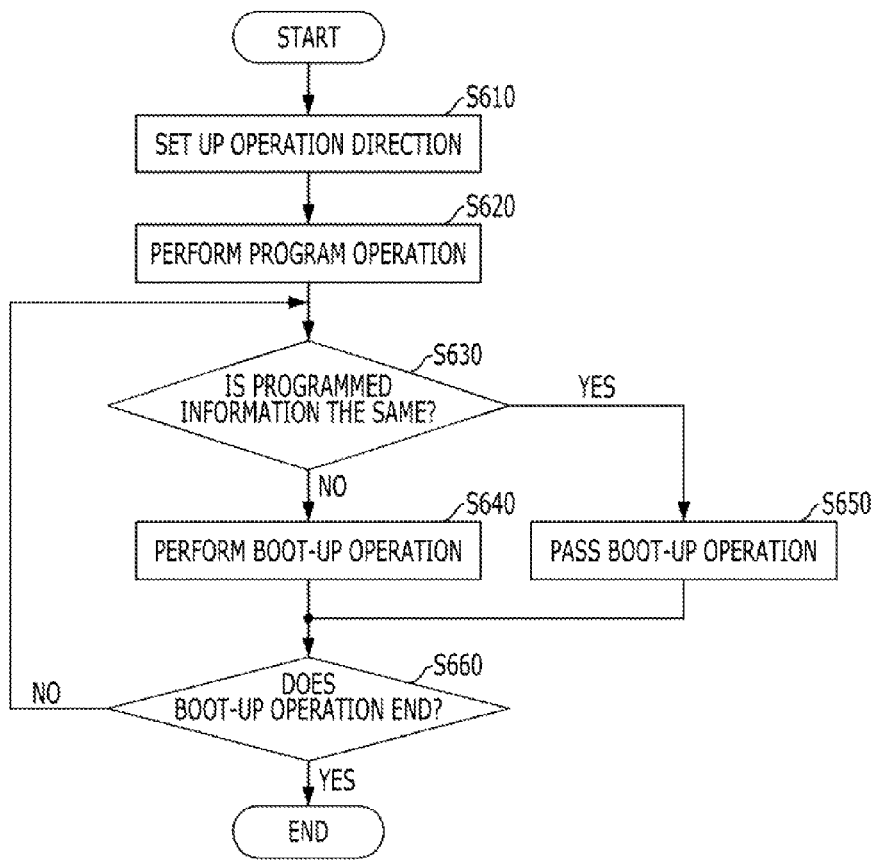
FIG. 6 is a flowchart describing the program operation and the hoot-up operation shown in FIGS. 4 and 5.

FIG. 6 is a flowchart describing the program operation and the boot-up operation shown in FIGS. 4 and 5.

Referring to FIG. 6, a method for operating the semiconductor memory device includes setting up the operation direction in step S610, performing the program operation in step S620, comparing the information which is programmed in step S630, performing the boot-up operation in step S640 passing the boot-up operation in step S650, and determining whether the boot-up operation ends in step S660.

The operation direction is set up in the step S610. In other words, the program operation direction and the boot-up operation direction are set up in the step S610. For example, in cases of FIGS. 4 and 5, the program operation direction may be set up to be opposite to the boot-up operation direction.

The program operation is performed in the step S620. In the step S620, the repair target address information is programmed based on the program operation direction which is set up in the step S610.

The information which is programmed is compared to each other in the step S630. In the step S630, when the repair target address information which is programmed in the fuses are different from each other ('NO'), the step S640 is carried out. When the repair target address information is the same ('YES'), the step S650 is carried out. Herein, there are various ways to compare the repair target address information with each other. A first repair target address information which is loaded by a boot-up operation performed already may be compared with a second repair target address information which is outputted through another boot-up operation being performed. The structure corresponding to the procedure is described below with reference with FIG. 8.

The boot-up operation is performed in the step S640. In the step S640 the boot-up operation is performed on the repair target address '100' which is accessed first based on the boot-up operation direction, as shown in FIGS. 4 and 5.

The boot-up operation is passed in the step S650. In the step S650, the boot-up operation is not performed on the repair target address '100' on which the boot-up operation is already performed, as shown in FIGS. 4 and 5.

Whether or not the boot-up operation ends is determined in the step S660. In the step S660, when the boot-up operation continues to be performed ('NO'), the step S630 is carried out again, and when the boot-up operation does not need to be further performed ('YES'), the boot-up operation ends.

The semiconductor memory device in accordance with the embodiment of the present invention may compare the repair target addresses, which are programmed in the fuses, with each other and control whether the boot-up operation is performed based on a comparison result. Consequently, the boot-up operation time may be minimized.

Figure 7:
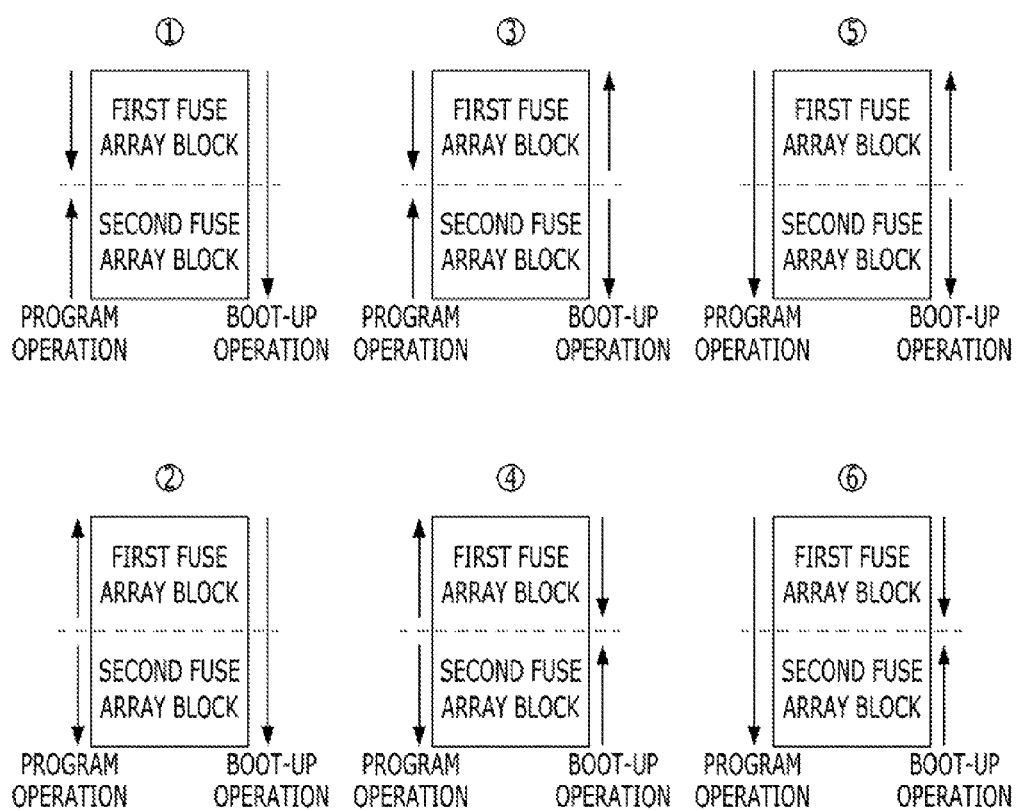
FIG. 7 exemplarily illustrates the program operation and the boot-up operation in accordance with the embodiment of the present invention.

FIG. 7 exemplarily illustrates the program operation and the boot-up operation in accordance with the embodiment of the present invention. FIG. 7 shows examples of the program operation and the boot-up operation. For the simple description, the fuse array block is divided into first and second fuse array blocks in FIG. 7. The first and second fuse array blocks may be distinguished from one another on a physical or a logical basis. Furthermore, the first and second fuse array blocks may be distinguished from one another based on the kind of state information which is programmed. The state information which distinguishes the first and second fuse array blocks indicates different kinds of state information, and may include state information having different program operation times. For example, the state information which is programmed during a test operation before packaging and the state information which is programmed during a test operation after packaging may be distinguished from each other as different state information, and the state information which is programmed afterwards may be also distinguished as different state information.

In cases ① shown in FIG. 7, the program operation is performed on the first fuse array block in a forward direction, and the boot-up operation is performed on the first fuse array block in the forward direction. The program operation is performed on the second fuse array block in a reverse direction, and the boot-up operation is performed on the second fuse array block in the forward direction.

In case ② shown in FIG. 7, the program operation performed on the first fuse array block in the reverse direction, and the boot-up operation is performed on the first fuse array block in the forward direction. The program operation is performed on the second fuse array block in the forward direction, and the boot-up operation is performed on the second fuse array block in the forward direction.

As shown in ① and ②, the semiconductor memory device in accordance with the embodiment of the present invention has different program operation directions and the same boot-up operation direction on the first and second fuse array blocks.

In case ③ shown in FIG. 7, the program operation is performed on the first fuse array block in the forward direction, and the boot-up operation is performed on the first fuse array block in the reverse direction. The program operation is performed on the second fuse array block in the reverse direction, and the boot-up operation is performed on the second fuse array block in the forward direction.

In cases ④ shown in FIG. 7, the program operation is performed on the first fuse array block in the reverse direction, and the boot-up operation is performed on the first fuse array block in the forward direction. The program operation is performed on the second fuse array block in the forward direction, and the boot-up operation is performed on the second fuse array block in the reverse direction.

As shown in ③ and ④, the semiconductor memory device in accordance with the embodiment of the present invention has program operation directions and boot-up operation directions that are opposite each other, on the first and second fuse array blocks.

In case ⑤ shown in FIG. 7, the program operation is performed on the first fuse array block in the forward direction, and the boot-up operation is performed on the first fuse array block in the reverse direction. The program operation is performed on the second fuse array block in the forward direction, and the boot-up operation is performed on the second fuse array block in the forward direction.

In case ⑥ shown in FIG. 7, the program operation is performed on the first fuse array block in the forward direction, and the boot-up operation is performed on the first fuse array block in the forward direction. The program operation is performed on the second fuse array block in the forward direction, and the boot-up operation is performed on the second fuse array block in the reverse direction.

As shown in ⑤ and ⑥, the semiconductor memory device in accordance with the embodiment of the present invention has the same program operation direction and different boot-up operation directions on the first and second fuse array blocks.

Figure 8:
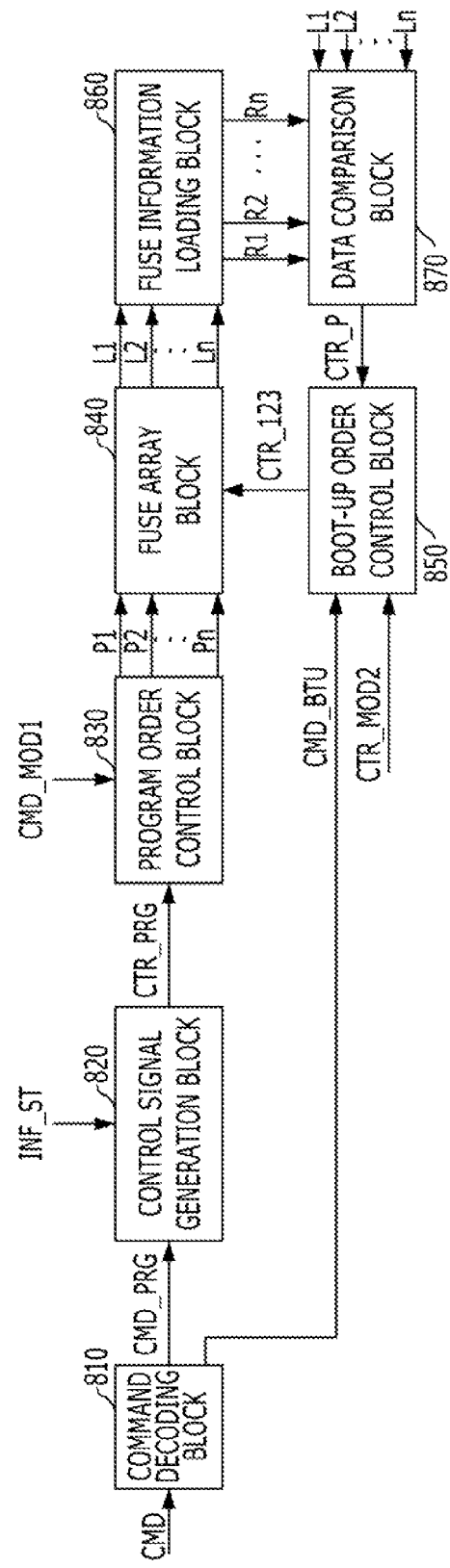
FIG. 8 is a block diagram illustrating a semiconductor memory device in accordance with another embodiment of the present invention.

FIG. 8 is a block diagram illustrating a semiconductor memory device in accordance with another embodiment of the present invention. FIG. 8 illustrates a semiconductor memory device capable of performing a comparison operation on the repair target addresses shown in FIGS. 4 and 5.

Referring to FIG. 8, the semiconductor memory device includes a command decoding block 810, a control signal generation block 820, a programming order control block 830, a fuse array block 840, a boot-up order control block 850, a fuse information loading block 860 and a data comparison block 870. Since the structure of FIG. 8 corresponds to the structure of FIG. 3, added or different blocks to or from those of FIG. 3 are described below.

The data comparison block 870 compares information R1, R2, . . . , and Rn that is loaded in the fuse information loading block 860 with output signals L1, L2, . . . , and Ln of the fuse array block 840, and generates an operation control signal CTR_P. The operation control signal CTR_P controls whether a boot-up operation is performed. When the information R1, R2, . . . , and Rn that is loaded in the fuse information loading block 860 and the output signals L1, L2, . . . , and Ln of the fuse array block 840 is the same, the operation control signal CTR_P controls the boot-up operation not to be performed.

The boot-up order control block 850 may generate a boot-up enable control signal CTR_123 in response to the operation control signal CTR_P and the fuse array block 840 may control whether the boot-up operation is performed in response to the boot-up enable control signal CTR_123. A circuit operation thereon is described in detail with reference to FIGS. 4, 5 and 6.

The semiconductor memory device in accordance with the embodiments of the present invention may control whether to pass a boot-up operation on the same repair target address which is programmed beforehand by comparing a repair target address which is loaded beforehand with a repair target address which is being booted up.

As described above, the semiconductor memory device in accordance with the embodiments of the present invention may control a program operation direction and a boot-up operation direction of a fuse array circuit and minimize boot-up operations and loading operations.

The overall operation rate of a circuit using a fuse array circuit may increase by increasing the operation effectiveness of the fuse array circuit.

While the present invention has been described with respect to specific embodiments, it is noted that the embodiments of the present invention are not restrictive but descriptive. Further, it is noted that the present invention may be achieved in various ways through substitution, change, and modification, by those skilled in the art without departing from the scope of the present invention as defined by the following claims.

What is claimed is:

1. A semiconductor memory device, comprising:
   a fuse array block including a plurality of fuses programmed with state information;
   an operation direction control block suitable for controlling a program operation direction and a boot-up operation direction of the fuse array block; and
   a fuse information loading block suitable for loading the state information which is programmed in the plurality of fuses of the fuse array block through the boot-up operation.

2. The semiconductor memory device of claim 1, wherein the operation direction control block includes:
   a programming order control block suitable for controlling the program operation direction of the fuse array block; and
   a boot-up order control block suitable for controlling the boot-up operation direction of the fuse array block.

3. The semiconductor memory device of claim 1, further comprising:
   a command decoding block suitable for decoding a command signal and generating an internal command signal corresponding to a program operation and a boot-up operation of the fuse array block; and
   a control signal generation block suitable for generating a programming control signal for changing connection states of the fuses and applying the programming control signal to the operation direction control block in response to the state information.

4. The semiconductor memory device of claim 3, wherein the programming order control block receives the programming control signal and sequentially applies the programming control signal to programming target fuses among the fuses in an order determined based on the program operation direction.

5. The semiconductor memory device of claim 1, wherein the fuse array block sequentially outputs the state information which is programmed in the fuses in an order determined based on an output signal of the boot-up order control block.

6. The semiconductor memory device of claim 1, wherein the program operation direction is opposite to the boot-up operation direction.

7. The semiconductor memory device of claim 1, wherein the fuse array block is divided into a first fuse array block and a second fuse array block, and the operation direction control block controls program operation directions and boot-up operation directions of the first and second fuse array blocks.

8. The semiconductor memory device of claim 7, wherein the first and second fuse array blocks are distinguished from one another based on kinds of the state information which is programmed therein.

9. A semiconductor memory device, comprising:
   a fuse array block including a plurality of fuses programmed with repair target address information;
   a programming order control block suitable for controlling a program operation direction of the fuse array block;
   a boot-up order control block suitable for controlling a boot-up operation direction of the fuse array block in an opposite direction to the program operation direction; and
   a fuse information loading block suitable for loading the repair target address information which is programmed in the plurality of fuses of the fuse array block through the boot-up operation.

10. The semiconductor memory device of claim 9, further comprising:
    a data comparison block suitable for comparing a repair target address which is loaded on the fuse information loading block with a repair target address which is outputted from the fuse array block through the boot-up operation and generating an operation control signal.

11. The semiconductor memory device of claim 10, wherein the boot-up order control block controls whether the boot-up operation is performed in response to the operation control signal.

12. The semiconductor memory device of claim 9, wherein the fuse array block outputs the target address information during the boot-up operation in a reverse order to the manner in which the target address information is programmed in the plurality of fuses.

13. The semiconductor memory device of claim 9, wherein the repair target address, which is loaded in the fuse information loading block, is used for a repair operation of the semiconductor memory device.

14. A method for operating a semiconductor memory device, comprising:
    setting up a program operation direction and a boot-up operation direction for a plurality of fuses;
    programming repair target address information in the fuses based on the program operation direction which is set up in the setting up;
    comparing the repair target address information which is programmed in the fuses;
    determining whether to perform a boot-up operation in response to a result obtained from the comparing of the repair target address information; and
    booting up the repair target address information which is programmed in the fuses based on the boot-up operation direction which is set up in the setting up, in response to a result obtained from the determining.

15. The method of claim 14, further comprising:
passing the boot-up operation in response to the result obtained from the determining.

16. The method of claim 14, further comprising:
loading a repair target address which is outputted through the booting-up of the repair target address information.

17. The method of claim 16, wherein the comparing of the repair target address information includes comparing the repair target address, which is loaded in the loading, with the repair target address which is outputted through the booting-up.

18. The method of claim 14, wherein the program operation direction is opposite to the boot-up operation direction.

19. A semiconductor memory device, comprising:
a fuse array block including a plurality of fuses;
a programming order control block suitable for programming state information in the plurality of fuses in a first order; and
a boot-up order control block suitable for controlling the fuse array block to output state information programmed in the plurality of fuses in a second order,
wherein the first and second orders are in reverse.

20. The semiconductor memory device of claim 19, further comprising:
a fuse information loading block suitable for loading state information outputted from the fuse array block; and
a data comparison block suitable for comparing the state information outputted from the fuse array block with state information loaded on the fuse information loading block and generating an operation control signal,
wherein the boot-up order control block controls whether the fuse array block outputs the state information in response to the operation control signal.

* * * * *